United States Patent
Yang et al.

[11] Patent Number: 6,161,000
[45] Date of Patent: Dec. 12, 2000

[54] TRANSMIT-RECEIVE SYSTEM AND TRANSMISSION METHOD, IN PARTICULAR FOR A MOBILE TELEPHONE

[75] Inventors: Fuji Yang, Clichy; Pierre Genest, Butry sur Oise; Eric Dussauby, Vaucresson; Corinne Berland, Paris; Arnaud Maecker, Asnieres, all of France

[73] Assignee: Alcatel, Paris, France

[21] Appl. No.: 09/328,598

[22] Filed: Jun. 10, 1999

[30] Foreign Application Priority Data

Jun. 11, 1998 [FR] France .................................. 98 07340

[51] Int. Cl.$^7$ .................................................. H01Q 11/12
[52] U.S. Cl. .............................. 455/118; 455/76; 455/112
[58] Field of Search ..................................... 455/118, 119, 455/112, 113, 126, 129, 85, 86, 87, 75, 76

[56] References Cited

U.S. PATENT DOCUMENTS

| | | |
|---|---|---|
| 4,313,209 | 1/1982 | Drucker ................................. 455/112 |
| 5,038,404 | 8/1991 | Marz . |
| 5,055,802 | 10/1991 | Hietela et al. ............................. 331/16 |
| 5,128,633 | 7/1992 | Martin et al. . |
| 5,130,676 | 7/1992 | Mutz ..................................... 332/100 |
| 5,390,346 | 2/1995 | Marz ..................................... 455/260 |
| 5,572,168 | 11/1996 | Kasturia . |
| 5,898,906 | 6/1999 | Williams ................................... 455/75 |
| 5,963,852 | 10/1999 | Schlang et al. ........................... 455/76 |
| 5,991,632 | 11/1999 | Guillame ................................. 455/466 |
| 6,008,703 | 12/1999 | Perrott et al. ........................... 332/100 |
| 6,009,312 | 12/1999 | Dolman ................................... 455/76 |
| 6,009,313 | 12/1999 | Ichiyoshi ................................. 455/76 |

FOREIGN PATENT DOCUMENTS

| | | |
|---|---|---|
| 0 678 974 A2 | 10/1995 | European Pat. Off. . |
| 0 817 370 A1 | 1/1998 | European Pat. Off. . |
| 2 278 511 | 11/1994 | United Kingdom . |

*Primary Examiner*—Fan Tsang
*Assistant Examiner*—Marceau Milord
*Attorney, Agent, or Firm*—Sughrue, Mion, Zinn, Macpeak & Seas, PLLC

[57] ABSTRACT

A transmit-receive system includes a phase-locked loop and a translation frequency loop. To bring about frequency hops, the frequencies in the two loops are varied with large increments in opposite directions. It is shown that the noise caused by the frequency division in the loops is thereby reduced.

11 Claims, 2 Drawing Sheets

TRANSMIT-RECEIVE SYSTEM AND TRANSMISSION METHOD, IN PARTICULAR FOR A MOBILE TELEPHONE

The present invention concerns a transmit-receive system and a transmission method that can be used in the field of mobile telephony in particular. The preferred field of the invention is that of mobile telephony because TDMA and FDMA mobile telephony both require regular transmit frequency hopping. From the point of view of the mobile telephony system, frequency hopping changes channel and this distributes noise present in particular frequency bands between a plurality of calls between mobile telephones and base transceiver stations. The invention is thus directed to enabling frequency agility. In this regard it could also be used in the field of radar, for example in the area of countermeasures.

BACKGROUND OF THE INVENTION

Transmit systems generally include a set of phase-locked loops. Each phase-locked loop includes a voltage-controlled oscillator. The principle of such transmit systems is to mix waves produced by the phase-locked loops to produce a transmit wave. There is generally a first loop whose oscillator oscillates at an intermediate frequency, for example around 100 MHz or 200 MHz, and a second loop whose oscillator oscillates at a translation frequency. In the Global System for Mobile Communications (GSM), for example, the translation frequency can be in the order of 800 MHz for transmission at around 900 MHz. In the Digital Cellular System (DCS), it is in the order of 1,700 MHz for transmission at around 1,800 MHz. The waves at the intermediate and translation frequencies are usually combined directly. They can equally be combined in a third loop. The signal from the intermediate frequency loop then serves as a set point for a phase comparator of the third loop, which receives a signal resulting from subtracting the signal at the translation frequency from a signal at a transmit frequency.

A phase-locked loop essentially comprises a voltage-controlled variable frequency oscillator whose output is connected to the input of a frequency divider. The output of the frequency divider is connected to the input of a phase comparator which also receives a set point signal at a frequency to be complied with. The phase comparator delivers a control signal which is preferably filtered by a low-pass filter. The control signal delivered by the low-pass filter controls the voltage-controlled oscillator. At the output of the oscillator, this produces a signal whose frequency is the frequency of the signal injected as a set point into the phase comparator multiplied by a divider coefficient of the frequency divider.

The frequency hops, corresponding to multiples of a standard channel bandwidth, are multiples of standard values. The GSM uses channel bandwidths of 200 kHz, for example. The various channels are therefore spaced from each other by a frequency increment equal to 200 kHz.

In the prior art the divider coefficient of the divider incorporated in the frequency translation loop is modified to bring about the required frequency hops by addition/subtraction. In the GSM, for example, with an increment of 200 kHz and translation frequencies equal to 1,700 MHz, the divider coefficient is in the order of 8,500. The coefficient varies by one or more units according to whether the required frequency hop is one or more times the 200 kHz increment.

A solution of the above kind is not totally satisfactory because the translation frequency loop with a frequency divider unfortunately generates unwanted noise in the transmitted band, despite all the precautions taken in implementing it. The oscillator and all components in a loop of the above kind produce noise. The noise at the output of a transmit system of the above kind is essentially proportional to the divider coefficient of the frequency translation loop divider.

OBJECTS AND SUMMARY OF THE INVENTION

The invention solves this problem by obtaining the frequency increment required for transmission, which must be low in value (200 kHz in a preferred example), by subtraction two increments which themselves are not low. In one example, a first variation increment is 5.2 MHz with a comparison frequency of 2.6 MHz. Another increment is 5 MHz with a comparison frequency of 1 MHz. By subtracting one of these variation increments from the other, it is possible to obtain a small increment without having to bring about small variations in frequency. In accordance with the invention, the subtraction is obtained by increasing the frequency of the translation frequency loop (by the increment of 5.2 MHz) and decreasing the frequency of the intermediate frequency loop (by the 5 MHz increment). Addition produces an increment of low value (0.2 MHz).

It can be shown that under the above conditions the divider coefficient of the translation frequency loop divider can change from 8,500 to 600, approximately.

When a frequency hop is effected, the phase-locked loops must go to the new frequency value as fast as possible. The speed at which this happens is proportional to the bandwidth of the low-pass filter connected to the output of the comparator. Because the comparison frequency is much higher using the invention it is possible to have a much higher cut-off frequency. With a much higher filter cut-off frequency, the time to reach the new frequency is shorter. With the invention this speed is much higher and the new frequency is reached faster because a much higher comparison frequency is chosen for the frequency hops in the loops themselves.

Finally, because the circuits of the invention are less noisy, it is possible to integrate them into the same integrated circuit, which reduces their cost enormously and increases their reliability very considerably.

To solve the first problem, the invention therefore consists in a transmitter system, in particular for a mobile telephone, including, connected to each other, first, second and third phase-locked loops for respectively producing a signal at an intermediate frequency, a signal at a translation frequency and a signal at a transmit frequency, the value of the transmit frequency being equal to the sum of the values of the intermediate and translation frequencies, wherein the values of the intermediate and translation frequencies are programmable by divider circuits and wherein the variations in the coefficients of the divider circuits are related by a variation of the transmit frequency to be obtained.

It also consists in a transmission method, in particular for a mobile telephone, including the following steps first, second and third phase-locked loops respectively produce a signal at an intermediate frequency, a signal at a translation frequency and a signal at a transmit frequency, and the three loops are interconnected so that the value of the transmit frequency is equal to the sum of the values of the intermediate frequency and the translation frequency, wherein the value of the intermediate frequency is decreased at the same time as the value of the translation frequency is increased, or vice versa, so that the transmit frequency is varied because of these increases and decreases.

Another problem is encountered with the transmitter-receivers of mobile telephones if the information bit rate is increased, in particular in the context of the HSCSD-JPRS standard. A saving is generally obtained in such mobile telephones by using some of the transmit circuits for the receive function. Because the transmit and receive frequency bands are different, frequency hopping is necessary at the end of a transmit (or receive) time slot to lock the receiver (or the transmitter) to a different carrier frequency of a transmit (or receive) carrier. In the case of transmission at a high bit rate (56 kbit/s), a transmitter can transmit during two or even more successive time windows within the same GSM frame. In this case, the time remaining for the frequency hop between the transmit carrier and the receive carrier, or vice versa, is reduced. For example, it can become as short as a single GSM slot (and no longer equal at most to a frame period). In this case the time to reach the new frequency, even if shortened as described above, is still too long.

To solve the second problem the invention provides the transmit-receive system with a phase-locked loop dedicated to reception and two voltage-controlled oscillators. One oscillator is used for transmission and the other for reception. It is then possible to anticipate the locking time of a phase-locked loop to begin the change to the new frequency. This solves the problem of stabilizing the frequency of the carrier signals at the required time.

The invention therefore also consists in a transmitter-receiver system, in particular for a mobile telephone, including, connected to each other, first, second and third phase-locked loops for respectively producing a signal at an intermediate frequency, a signal at a translation frequency and a signal at a transmit frequency, the transmit frequency being equal to the sum of the intermediate and translation frequencies, wherein the translation loop is duplicated in the form of respective first and second translation loops for use in a transmit circuit and a receive circuit, each of the two loops including in series a voltage-controlled variable frequency oscillator, a frequency divider, a phase comparator and a low-pass filter.

BRIEF DESCRIPTION OF THE DRAWINGS

The invention will be better understood after reading the following description and examining the accompanying drawings. The drawings are given by way of illustrative and non-limiting example of the invention. In the figures.

MORE DETAILED DESCRIPTION

Figures 1, 2:
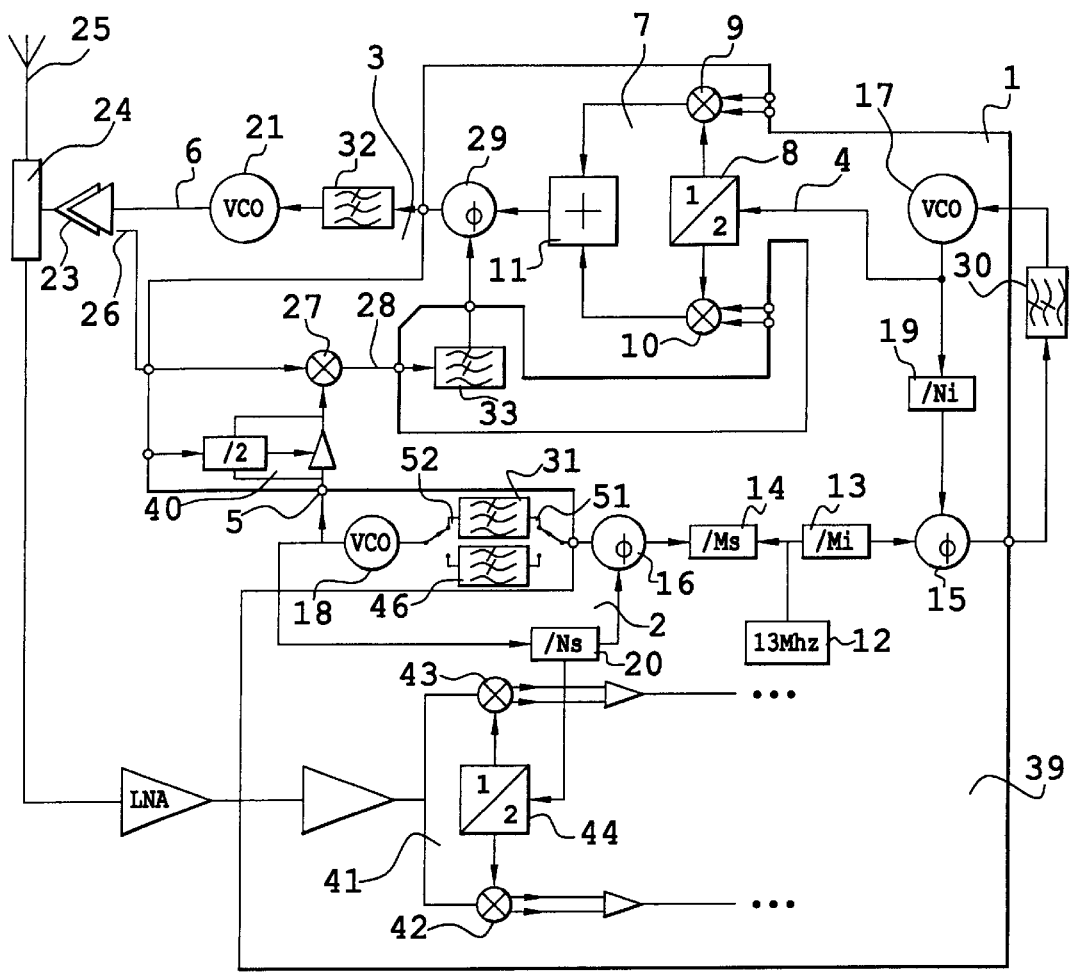
FIG. 1 is a functional block diagram of a transmission system in accordance with the invention including an associated demodulator and implemented in an integrated circuit.
FIG. 2 is a table showing the evolution of the divider coefficients in the intermediate and translation frequency loops, the corresponding frequency differences obtained, and the resulting transmit frequency.

FIG. 1 shows a transmission system in accordance with the invention. The system is intended to be used in the field of mobile telephony in particular. It includes three phase-locked loops 1 to 3. The first loop 1 is an intermediate frequency loop and produces at its output 4 a signal at an intermediate frequency. The second loop 2 is a translation frequency loop and produces at its output 5 a signal at a translation frequency. The third loop is a transmit loop and produces at its output 6 a signal at a transmit frequency. In one example, the signal available at the output 4 has a frequency in the order of 100 MHz and that available at the output 5 has a frequency in the order of 1,700 MHz. The value of the transmit frequency is thus formed additively from the values of the intermediate and translation frequencies. In the DCS, the transmit frequency is in the order of 1,800 MHz (it varies with the frequencies allocated to a given telecommunication operator). In the GSM, these values must be modified so that the transmit frequency is 900 MHz.

It is nevertheless possible to obtain the transmit frequency by subtracting the value of the intermediate frequency from the value of the translation frequency. The terminology of additive formation is nevertheless used here because the translation frequency would then be the result of adding the transmit frequency and the intermediate frequency.

The transmit system of the invention further includes a modulator 7 in the connections between the loops. In the example shown, the modulator circuit 7 is in the connection between the loop 1 and the loop 3. It could nevertheless be between any of the loops. The aim is to modulate the signal available at the transmit frequency by a modulating signal to be transmitted. The modulating signal to be transmitted represents information. Here it is an analog signal with two components I and Q (and complementary values NI and NQ).

In the modulator circuit 7 the intermediate frequency signal available at the output 4 is fed into a 90° phase-shifter 8 whose outputs, with a relative phase difference of 90°, drive respective mixers 9 and 10. In a manner that is known per se, the 90° phase-shifter includes a double frequency divider which divides by two triggered by a rising edge and a falling edge of the intermediate frequency signal. In practice the frequency of the intermediate frequency signal is for this reason twice that referred to until now. However, this in no way alters the general applicability of the invention since it is sufficient to double all the values relating to the first loop to obtain the system in accordance with the invention. The 90° phase-shifted components of the intermediate frequency signal are mixed with the signals I and Q. The outputs of the mixers 9 and 10 are combined in an adder 11 which delivers a modulated signal.

Any other type of modulator circuit could of course be used. In particular, the location of the modulator circuit could be different. In some cases, the modulator circuit is in the transmit loop.

The frequencies of loops 1 and 2 are locked by a reference signal produced by a reference circuit 12. In a preferred example, which will be used for simplicity until the end of the particular description, the signal produced by the reference circuit 12 has a frequency Fref of 13 MHz. This signal could have any other value, however. In one example the reference circuit 12 includes a quartz crystal. The reference signal 12 is fed, in particular via dividers 13 and 14 with respective divider coefficients Mi and Ms, to the set point inputs of respective phase comparators 15 and 16 of the loops 1 and 2. The phase comparators 15 and 16 also receive the output signals of two voltage-controlled oscillators 17 and 18 of the loops divided by respective dividers 19 and 20 with respective divider coefficients Ni and Ns in loops 1 and 2.

Assuming that the value of the coefficient Mi is 13, the signal available at the output of the divider 13 has a frequency of 1 MHz. The signal delivered by the phase comparator 15 therefore controls the oscillator 17 so that the result of dividing the signal produced by the oscillator 17 by Ni is also a signal at 1 MHz. The signal available at the output 4 therefore has a frequency of Ni×1 MHz. In other words, the function of a loop is to produce at its output a signal whose frequency is the product of the frequency of the set point signal and the divider coefficient of the loop. In loop 1, the oscillator 17 has an output connected to the input of the divider 19 and to the input of the modulator circuit 7, in a manner that is known per se. This output delivers the signal at the intermediate frequency.

In the prior art, given the necessity of a low increment for the frequency hops (200 kHz in a preferred case) the frequency of the set point signal of the frequency translation loop 2 must necessarily be set to this low value. Given these conditions, the divider coefficient Ns of the divider 20 has had a high value. In one example it was 8,500, to convert a signal at 1,700 MHz to a signal with a frequency comparable to 200 kHz.

The invention works completely differently. The transmit frequency available at the output 6 is the result of adding the frequency of the signal available at the output 4 to the frequency of the signal available at the output 5. The frequency of the signal available at the output 5 is therefore increased with a large increment. In one example a large increment of 5.2 MHz is chosen, with a comparison frequency of 2.6 MHz. To compensate this, the frequency of the signal supplied by the other loop (loop 1) is decreased, also with a large decrement. In the prior art, the intermediate frequency loop 1 had a fixed frequency. Using the invention, the frequency of the signal available in that loop varies with the frequency hops.

The two signals are preferably added in the third loop 3, in the following manner. The loop 3 also includes a voltage-controlled oscillator 21. The output 6 of the oscillator 21 is connected to transmit equipment including an amplifier 23, a duplexer 24 and a transmit antenna 25. The signal available at the output 6 is sampled by a sensor 26 before amplification. A mixer 27 mixes the sampled signal with the signal available at the output 5 of the loop 2. The signal resulting from mixing by the mixer 27 and available at an output 28 is fed into a phase comparator 29 where it is compared to the signal delivered by the transmit system 7 and therefore, insofar as the transmit frequency carrier is concerned, by the intermediate frequency loop 1. The mixer 27 adds and subtracts the frequencies of the signals available at the outputs 5 and 6. The addition component is eliminated by a low-pass filter 33. The signal delivered by the comparator 29 controlling the oscillator 21 is such that the result of the subtraction must be equal to the signal at the intermediate frequency, disregarding the modulation signals I and Q.

The phase comparators 15, 16 and 29 are connected to the voltage-controlled oscillators 17, 18 and 21 by respective low-pass filters 30, 31 and 32. The filter 30 has a low cut-off frequency in the order of 100 kHz. The filter 31 has a low cut-off frequency in order of 100 kHz to 200 kHz. The filter 32 has a low cut-off frequency in the order of 200 kHz to 300 kHz. The cut-off frequency of the filter 33 is in the order of 200 MHz. The filters 30 to 33 are loop filters.

In the circuit shown, the dividers 13, 14, 19 and 20 are essentially programmable. The skilled person can easily implement such dividers using counters that are reset to zero automatically and retriggered as soon as they reach a predetermined value. The signal retriggering the counters represents the divided frequency signal. The predetermined value represents the divider coefficient.

FIG. 2 is a table which explains simply how the invention works, using a numerical example. A first column 34 in the table indicates possible values of the divider coefficient Ni of the divider 19. A second column 35 indicates the value of the intermediate frequency that is therefore available at the output 4. A third column 36 indicates the value of the divider coefficient Ns of the divider 20. A fourth column 37 indicates the frequency of the signal at the translation frequency available at the output 5. A final column 38 indicates the value of the frequency of the resulting transmit signal.

As already explained, the coefficient Mi of the divider 13 is preferably equal to 13 so that the frequency of the set point signal at the input of the comparator 15 is 1 MHz. The explanation remains valid if the coefficient Mi has a different value, however.

For example (see the first line of the table), if the coefficient Ni is set at 98, the frequency of the signal fed to the other input of the comparator 15 is equal to the frequency delivered by the oscillator 17 divided by 98. When it has been compared by the comparator 15 and then filtered by the filter 30, the signal resulting from such comparison is returned to the oscillator 17 as a control signal. In practice, if Ni is equal to 98, the frequency of the signal available at the output 4 is 98 MHz (98×1 MHz).

In a preferred embodiment the divider 14 has a divider coefficient Ms equal to 5. It could have some other value, however. Consequently, the signal at the set point input of the phase comparator 16 is at 2.6 MHz. Using the same reasoning as before, the signal available at the output 5 of the oscillator 18 has the set point value 2.6 MHz multiplied by the coefficient Ns. In one example, shown in the first row of the table, the value of Ns is 620. This produces a signal at the output 5 whose frequency is 1,612 MHz (620×2.6 MHz). After passing through the loop 3 the signal available at the output 6 of the modulator is at 1,710 MHz (98+1612=1710), as shown in column 38. The low value of the coefficient Ns is one of the essential features of the invention.

Because division has to be by integers (the processing is done in the digital domain), it is not possible to obtain from a signal at 13 MHz delivered by the reference circuit 12 an increment of 5.2 MHz by dividing by an integer Ms. Division by 2.5 would be required, and this is not an integer. To compensate for this problem, the coefficient Ns changes two units at a time (column 36).

If a basic frequency hop of 200 kHz is derived from the above, the translation loop frequency has to be made to jump 5.2 MHz. This is obtained by choosing a coefficient Ns equal to 622, producing a frequency in this loop of 1,617.2 MHz. A hop of 5.2 MHz relative to the previous situation is obtained. By way of compensation, the coefficient Ni is decreased by 5 units in loop 1. It is therefore reduced from 98 to 93. When the value of Ni is 93, as explained previously, the frequency of the intermediate frequency signal is 93 MHz. Combining the signals at 93 MHz and 1617.2 MHz in the loop 3 yields a signal at 1710.2 MHz. Thus the frequency hop with a small increment (200 kHz) is obtained by combining two large increments the difference between which is equal to the small increment.

The transmit frequency can be modified by increasing the coefficient Ns by 2 units and decreasing the coefficient Ni by 5 units. Frequencies below 1710 MHz can of course be obtained by increasing the coefficient Ni to 103 and then 108, and so on, and decreasing the coefficient Ns to 618 and then 616, and so on.

Thus the variations in the divider coefficients Ni and Ns are seen to be linked by a variation in the transmit frequency. When the coefficient Ni is varied by an increment A equal to 5, it produces a 5 MHz intermediate frequency variation increment "a". IN the second loop an increment B of 2 units of Ns causes a translation frequency increment "b" of 5.2 MHz. The transmit frequency changes with a frequency increment b−a equal to 200 kHz in this example.

The translation frequency Ft is equal to $F_{ref}*Ns/Ms$. The intermediate frequency Fi is equal to $F_{ref}*Ni/Mi$. As a result the variations a and b in these frequencies are written $b=F_{ref}*\Delta Ns/Ms$ and $a=F_{ref}*\Delta Ni/Mi$. $\Delta Ns$ is the increment b and $\Delta Ni$ is the increment a. As a result $a/b=(B/Ms)/(A/Mi)$. From this it can be deduced that the ratio Mi/Ms of the divider coefficients of the respective dividers 13 and 14 is equal to or proportional to Ab/aB. An increment a larger than the increment b could be chosen. In this case, the variation increment of the transmit frequency would be a−b.

This approach can run up against a limitation, namely the ability of the loop 1 to lock on throughout the required dynamic range of the frequency. In theory, the coefficient Ni could be reduced in this way to 1. In practice, the oscillators 17 used do not have a full range of electronic tuning. In this case, it is found that the frequency increments a and b can be combined differently. For example, as shown in the sixth line of the table, it is possible to obtain the transmit frequency of 1,711 MHz in two ways. Either the coefficient Ni is 73 and the coefficient Ns is 630, as a logical continuation of the variation of these coefficients in columns 34 and 36, respectively, or, and preferably, the coefficient Ni is 99 and the coefficient Ns is 620. This also arrives at the required result, but with limited variation of the coefficient Ni. Thus the values modulo a and modulo b are adjusted to produce a result modulo a−modulo b, or modulo a+modulo b, which enables a limited variation of the coefficient Ni.

FIG. 1 also shows in diagrammatic form another important feature of the invention, represented in the form of a shaded surface 39. The shaded surface 39 shows all the equipment of the modulator which can be integrated in the same integrated circuit. Apart from the filters 30 to 33 and the voltage-controlled oscillators 18 and 21, all the circuits described until now can be integrated in the same integrated circuit 39. This produces a very low cost architecture. Even the oscillator 17 can be integrated in the circuit 39.

A frequency divider 40 which divides by 2 is inserted between the output of the oscillator 18 and the input of the mixer 27. The divider 40 can be switched out of circuit. It enables the frequency of the signal at the translation frequency to be selectively divided by 2. In practice a divider 40 of this kind is used to switch from the DCS protocol (1,800 MHz) to the GSM protocol (900 MHz) without having to design a duplicated circuit. The divider 40 is also preferably integrated in the circuit 39.

FIG. 1 also shows that a receive circuit can be connected to the output of the duplexer 24 to produce the signals I and Q (or NI and NQ) by mixing the signal received and a signal produced by the loop 2 and passed through a 90° phase-shifter 44 in the mixers 42 and 43. The noise problem is less crucial for reception. In this case, when receiving, loops 1 and 3 are deactivated and loop 2 produces a signal at the receive frequency directly. In this mode of use the divider 14 is allocated a divider coefficient Ms of 65 to produce a comparison frequency of 200 kHz and the value of Ns is 8,500 so that the oscillator 18 produces a signal at a frequency in the order of 1,800 MHz in the context of the DCS. In this context, demodulation is direct with no intermediate frequency step.

Figure 3:
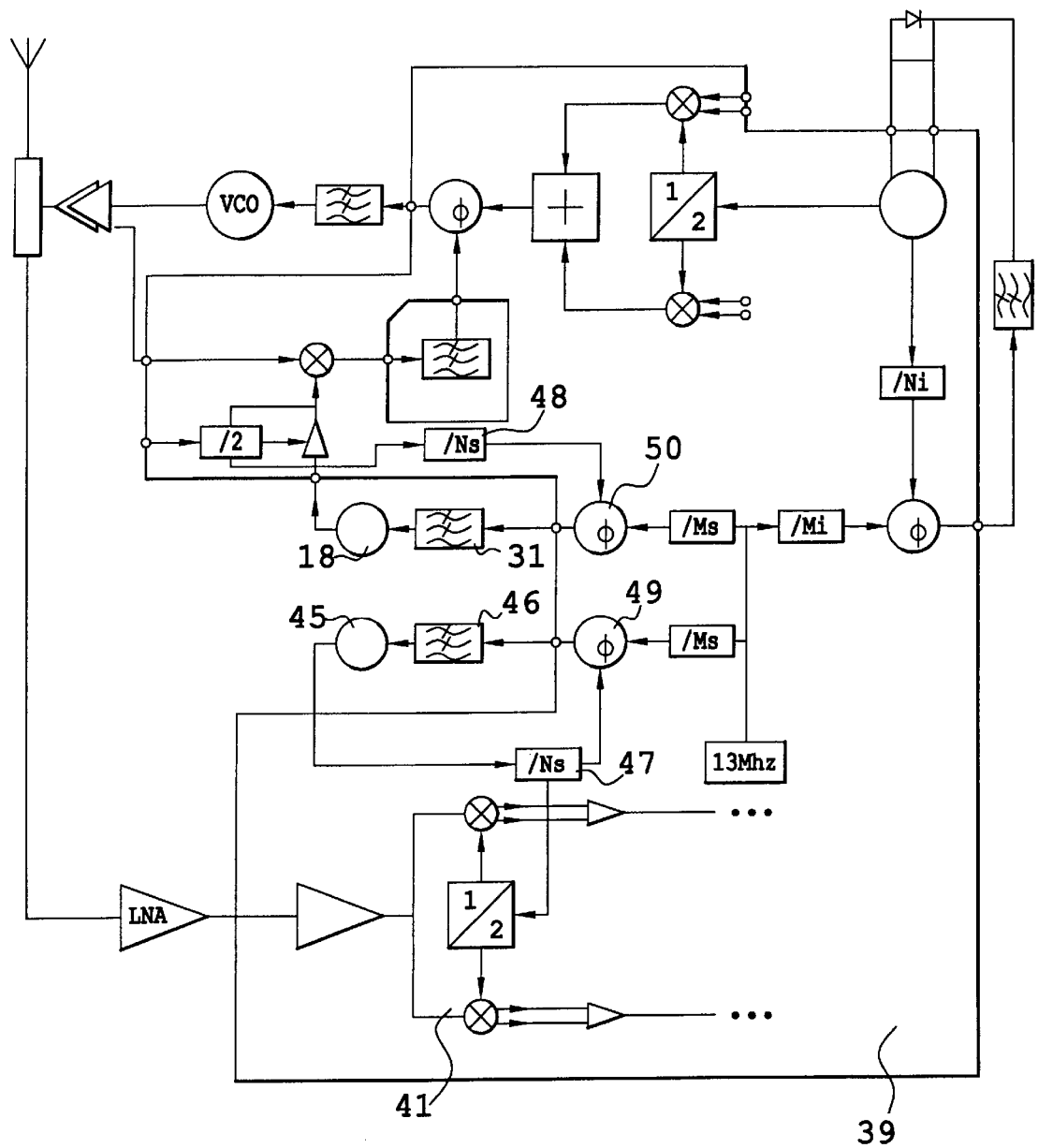
FIG. 3 shows a system in accordance with the invention comparable to that from FIG. 1, but in which the receive circuit has been modified.

FIG. 3 shows the same units as FIG. 1 with the difference that the oscillator 18 does not need to have an excessively high dynamic range. It shows an oscillator 18 to be used for transmission and whose range of variation is typically from 1,530 MHz to 1,654 MHz in the DCS context and an oscillator 45 used for reception having a range of variation from 1,805 MHz to 1,920 MHz in the DCS context. In the FIG. 1 diagram, in contrast, the oscillator 18 has to have a dynamic range covering the receive band and the transmit band, to which is added a channel separation value. In the GSM context, the transmit and receive channels are separate.

In one example the transmit and receive channels each have a bandwidth of 35 MHz and are spaced by 10 MHz. Each of the two oscillators 18 and 45 can have a lower dynamic range of frequency variation. In this case the loop 2 is duplicated for use on transmission with the filter 31 and the oscillator 18 and for reception with a filter 46 and the oscillator 45. Given the intended frequencies, the cut-off frequency of the low-pass filter 46 can be in the order of 5 kHz to 10 kHz. The dividers 47 and 48 and the phase comparators 49 and 50 of each loop are preferably incorporated in the integrated circuit 39.

Above all else, this architecture has the advantage that the dividers 47 and 48 can be set up in advance, even before they are used, as soon as the carrier frequencies are known. In the GSM context, the frequency change on frequency hopping is the result of executing an algorithm stored in the mobile telephones. Thus in accordance with the invention the mobile telephones can anticipate the processing of the algorithm, define carrier frequencies that can be used in future time slots, deduce the divider coefficient values from them, and impose them on the dividers with sufficient timing advance for the regulator frequency from each translation loop to be well stabilized by the time it has to be used. Having two translation loops makes it possible to begin setting up one of the loops while the other is hard at work, for example. There is therefore no obligation to wait for the other loop to finish.

In the FIG. 1 solution, this anticipation is not required. For reception, the aim is rather to achieve a saving by using the components of loop 2 alternately to receive and transmit. In this case the filters 31 and 46 are connected alternately into loop 2 by means of two switches 51 and 52 connected to them. At the time of switching, the coefficient of the divider 20 must of course be changed to synthesize another carrier.

What is claimed is:

1. A transmitter system comprising:

a first phase locked loop for generating a first signal having an intermediate frequency, said first phase locked loop comprising a first frequency divider circuit having a first divider coefficient;

a second phase locked loop for generating a second signal having a translation frequency, said second phase locked loop comprising a second frequency divider circuit having a second divider coefficient;

a third phase locked loop connected to said first and second phase locked loops for generating a third signal having a transmit frequency, the value of the transmit frequency being equal to the sum of the values of the intermediate and translation frequencies, wherein the values of the intermediate and translation frequencies are programmable by said first and second divider circuits and said transmit frequency is incrementally varied by varying the first and second divider coefficients of the first and second frequency divider circuits in opposite directions.

2. A transmitter system according to claim 1, wherein said intermediate frequency is variable in a first frequency increment a, said translation frequency is variable in a second frequency increment b, and said transmit frequency is variable in increments equal to |a−b|, wherein the first frequency increment a is equal to a variation increment A of said first divider coefficient multiplied by a first comparison frequency fc1 receiving by said first phase locked loop, and the second frequency increment b is equal a variation increment B of said second divider coefficient multiplied by a second comparison frequency fc2 received by said second phase locked loop.

3. A transmitter system according to claim 2, further comprising:
   a frequency reference circuit for generating a reference frequency signal;
   a third frequency divider for receiving the reference frequency signal from the reference circuit to control the first phase locked loop, said third frequency divider having a divider coefficient Mi; and
   a fourth frequency divider for receiving the reference frequency signal from the reference circuit to control the second phase locked loop, said fourth frequency divider having a divider coefficient Mi, wherein a ratio Mi/Ms is proportional or equal to Ab/aB.

4. A transmitter system according to claim 1, wherein each of the first and second phase locked loops further comprises in series an oscillator, a phase comparator and a low-pass filter, wherein the frequency divider and phase comparator are integrated in an integrated circuit.

5. A transmitter system according to claim 1, further comprising a modulator circuit connected between the first phase locked loop and the second phase locked loop.

6. A transmitter system according to claim 1, further comprising:
   a demodulator circuit connected to the second phase locked loop; and
   two loop filters connected to the second phase locked loop by two switches.

7. A transmitter system according to claim 1, wherein the third phase locked loop includes a frequency divider which divides by 2 and can be switched for GSM or DCS use.

8. A transmission method comprising the steps of:
   generating a first signal having an intermediate frequency at a first phase locked loop;
   generating a second signal having a translation frequency at a second phase locked loop;
   generating a third signal a transmit frequency at a third phase locked loop connected to said first and second phase locked loops, wherein the value of the transmit frequency is equal to the sum of the values of the intermediate frequency and the translation frequency; and
   incrementally changing the value of the transmit frequency by increasing the value of the intermediate frequency while decreasing the value of the translation frequency, or by decreasing the value of the intermediate frequency while increasing the value of the translation frequency.

9. A method according to claim 8, wherein the translation frequency is increased or decreased with an increment b and the intermediate frequency is increased or decreased with an increment a so that the transmit frequency increases or decreases with an increment |a−b|.

10. A transmitter-receiver system comprising:
    a intermediate phase locked loop for generating a first signal having an frequency;
    a translation phase locked loop for generating a second signal having a translation frequency;
    a transmit phase locked loop connected to said first and second phase locked loops for generating a third signal having a transmit frequency, the transmit frequency being equal to the sum of the intermediate and translation frequencies and the transmit frequency is incrementally varied by varying the intermediate and translation frequencies in opposite directions, wherein the translation loop comprises first and second translation loops for use in a transmit circuit and a receive circuit, each of the first and second translation loops comprising a voltage-controlled variable frequency oscillator, a frequency divider, a phase comparator and a low-pass filter connected in series.

11. A system according to claim 10, wherein the frequency dividers and phase comparators of the first and second translation loops are integrated in the same integrated circuit as the phase comparator of the third loop.

* * * * *